(12) United States Patent
Bang et al.

(10) Patent No.: US 7,791,178 B2
(45) Date of Patent: Sep. 7, 2010

(54) LEAD FRAME UNIT, SEMICONDUCTOR PACKAGE HAVING A LEAD FRAME UNIT, STACKED SEMICONDUCTOR PACKAGE HAVING A SEMICONDUCTOR PACKAGE AND METHODS OF MANUFACTURING THE SAME

(75) Inventors: Hyo-Jae Bang, Cheonan-si (KR);
Heui-Seog Kim, Cheonan-si (KR);
Seong-Chan Han, Cheonan-si (KR);
Jung-Hyeon Kim, Hwaseong-si (KR);
Sung-Hwan Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 365 days.

(21) Appl. No.: 11/984,762

(22) Filed: Nov. 21, 2007

(65) Prior Publication Data

US 2008/0116546 A1    May 22, 2008

(30) Foreign Application Priority Data

Nov. 22, 2006    (KR) .................... 10-2006-0115672

(51) Int. Cl.
*H01L 23/495* (2006.01)

(52) U.S. Cl. .................... 257/666; 257/669; 257/674; 257/686; 257/778; 257/780; 257/784; 257/E23.031; 257/E23.049; 257/E23.051; 257/E23.053; 257/E23.056; 438/109; 438/123

(58) Field of Classification Search ......... 257/666–733, 257/E23.031–E23.059; 438/111, 112, 123, 438/FOR. 366, FOR. 367, FOR. 377, FOR. 380
See application file for complete search history.

(56) References Cited

U.S. PATENT DOCUMENTS 6,392,293 B2 *    5/2002    Sugihara et al. ............. 257/690

FOREIGN PATENT DOCUMENTS

| JP | 61-147555 | * 7/1986 | ................. 257/666 |
| JP | 08-279583 | 10/1996 | |
| JP | 2001-024140 | 1/2001 | |
| KR | 10-2003-0014863 | 2/2003 | |

OTHER PUBLICATIONS

Office Action dated Nov. 19, 2007 for corresponding Korean Application No. 10-2006-0115672.

* cited by examiner

*Primary Examiner*—Jasmine J Clark
(74) *Attorney, Agent, or Firm*—Harness, Dickey & Pierce, P.L.C.

(57) ABSTRACT

A lead frame unit, a semiconductor package having a lead frame unit, a stacked semiconductor package having a semiconductor package, and methods of manufacturing the same are provided. The lead frame unit in a stacked semiconductor package may include a die pad supporting a semiconductor chip, an inner lead electrically connected to the semiconductor chip, an outer lead extending from the inner lead, and a heat-resistant insulation member surrounding the connection portion. The outer lead may include a connection portion connected to the inner lead and a junction portion connected to the connection portion and a circuit board. An external signal may be applied to the junction portion. If the lead frame unit is used in the stacked semiconductor package, the outer lead and a dummy outer lead in the stacked semiconductor package may have substantially the same shape.

20 Claims, 10 Drawing Sheets

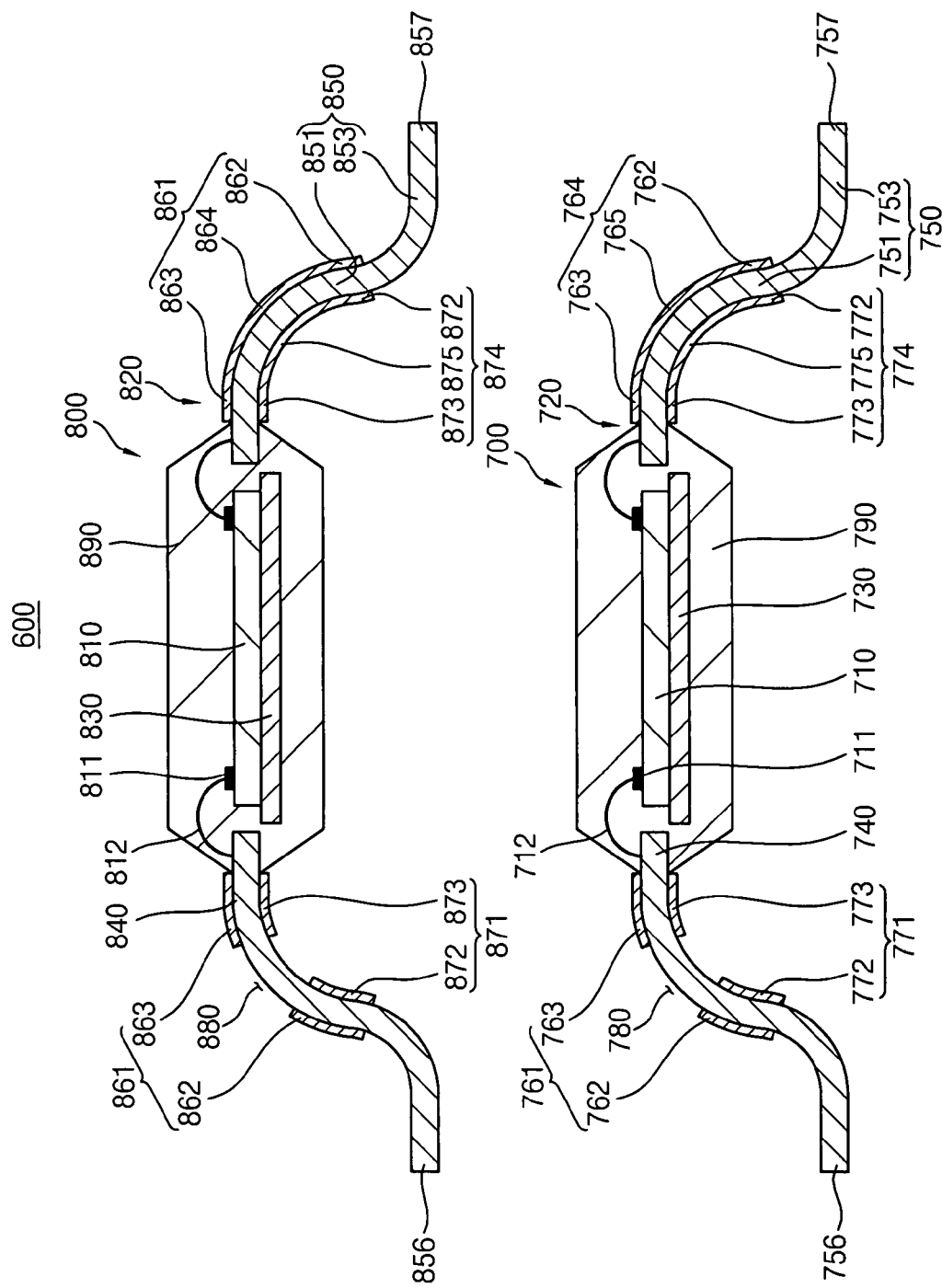

LEAD FRAME UNIT, SEMICONDUCTOR PACKAGE HAVING A LEAD FRAME UNIT, STACKED SEMICONDUCTOR PACKAGE HAVING A SEMICONDUCTOR PACKAGE AND METHODS OF MANUFACTURING THE SAME

PRIORITY STATEMENT

This application claims the benefit of priority under 35 U.S.C. §119 to Korean Patent Application No. 2006-115672, filed on Nov. 22, 2006 in the Korean Intellectual Property Office (KIPO), the contents of which are incorporated herein by reference in their entirety.

BACKGROUND

1. Field

Example embodiments relate to a lead frame unit, a semiconductor package having a lead frame unit, a stacked semiconductor package having a semiconductor package and methods of manufacturing the same. Other example embodiments relate to a lead frame unit used in the manufacturing process of a semiconductor package, a semiconductor package having a lead frame unit, a stacked semiconductor package having a semiconductor package and methods of manufacturing the same.

2. Description of the Related Art

A semiconductor device may be manufactured by performing a chip manufacturing process to manufacture a semiconductor chip including a silicon substrate and an integrated circuit formed on the silicon substrate, an electrical die sorting (EDS) process to electrically testing and sort the semiconductor chip, and a packaging process to protect the semiconductor chip.

Recently, chip scale package (CSP) technology and stacked package technology have been developed to increase the integration degree of semiconductor products.

A stacked package may include a first semiconductor package and a second semiconductor package stacked on the first semiconductor package. The first semiconductor package and the second semiconductor package may include an outer lead and a dummy outer lead, respectively. The outer lead of the second semiconductor package may be electrically connected to the outer lead of the first semiconductor package. The dummy outer lead of the second semiconductor package may be electrically insulated from the dummy outer lead of the first semiconductor package.

An outer lead (e.g., a selected outer lead) and the dummy outer lead of the first semiconductor package may be bent twice in a slanted "S" shape. According to example embodiments, the selected outer lead of the second semiconductor package may be bent in a reverse "L" shape to correspond to the outer lead of the first semiconductor package.

The dummy outer lead of the second semiconductor package may be cut (or formed) such that the dummy outer lead of the second semiconductor package is insulated from the dummy outer lead of the first semiconductor package. As described above, the outer leads of the first semiconductor package and the second semiconductor package have shapes different from each other. As such, it may be necessary to perform an additional forming process and a cutting process for the outer leads.

In a conventional stacked semiconductor package, if the second semiconductor package has a defect, it may be difficult to use the second semiconductor package as a single-type semiconductor package because the outer lead of the second semiconductor package has a shape different from that of the outer lead of the first semiconductor package. Thus, the production efficiency of the semiconductor package may decrease and manufacturing costs of the semiconductor package may increase.

SUMMARY

Example embodiments relate to a lead frame unit, a semiconductor package having a lead frame unit, a stacked semiconductor package having a semiconductor package and methods of manufacturing the same.

According to example embodiments, there is provided a lead frame unit. The lead frame unit may include a die pad, an inner lead, an outer lead and a heat-resistant insulation member. The die pad supports a semiconductor chip. The inner lead may be electrically connected to the semiconductor chip. The outer lead extends from the inner lead. The outer lead includes a connection portion connected to the inner lead and a junction portion to which an external signal is applied. The heat-resistant insulation member surrounds the connection portion.

According to example embodiments, there is provided a semiconductor package. The semiconductor package may include a semiconductor chip, a lead frame unit and a molding member. The lead frame unit includes a die pad, an inner lead, an outer lead and a heat-resistant insulation member. The die pad supports a semiconductor chip. The inner lead may be electrically connected to the semiconductor chip. The outer lead extends from the inner lead. The outer lead includes a connection portion connected to the inner lead and a junction portion to which an external signal is applied. The heat-resistant insulation member includes a first heat-resistant insulation film covering (or formed on) an upper surface of the connection portion and a second heat-resistant insulation film covering (or formed on) a lower surface of the connection portion opposite to the upper surface. The molding member surrounds the inner lead.

According to example embodiments, there is provided a method of manufacturing a semiconductor package. In the method of manufacturing the semiconductor package, a semiconductor chip and a lead frame unit are prepared. The lead frame unit may include a die pad, an inner lead, an outer lead and a heat-resistant insulation member. The die pad supports a semiconductor chip. The inner lead may be electrically connected to the semiconductor chip. The outer lead extends from the inner lead. The outer lead includes a connection portion connected to the inner lead and a junction portion to which an external signal is applied. The heat-resistant insulation member includes a first heat-resistant insulation film covering an upper surface of the connection portion and a second heat-resistant insulation film covering a lower surface of the connection portion opposite to the upper surface. The semiconductor may be placed (or mounted) on the die pad. The semiconductor chip may be electrically connected to the inner lead. The semiconductor chip and the inner lead may be molded.

According to example embodiments, there is provided a stacked semiconductor package. The stacked semiconductor package includes a first semiconductor package, a second semiconductor package and a conductive member. The first semiconductor package includes a first semiconductor chip and a first lead frame unit. The first lead frame unit includes a first inner lead, a first outer lead and a first heat-resistant insulation member. The first inner lead may be electrically connected to the first semiconductor chip. The first outer lead extending from the first inner lead includes a first connection portion connected to the first inner lead and a first junction portion to which an external signal is applied. The first heat-resistant insulation member may cover an upper surface and a lower surface of the first connection portion. The first heat-resistant insulation member has a first opening partially exposing the upper surface of the first connection portion. The second semiconductor package may be arranged on the first semiconductor package. The second semiconductor package includes a second semiconductor chip and a second lead frame unit. The second lead frame unit includes a second inner lead, a second outer lead and a second heat-resistant insulation member. The second inner lead may be electrically connected to the second semiconductor chip. The second outer lead extending from the second inner lead includes a second connection portion connected to the second inner lead and a second junction portion to which an external signal is applied. The second heat-resistant insulation member may cover an upper surface and a lower surface of the second connection portion. The conductive member electrically connects the first connection portion exposed through the first opening with the second junction portion.

According to example embodiments, there is provided a method of manufacturing the stacked semiconductor package. In the method of manufacturing the stacked semiconductor package, a first semiconductor package is prepared. The first semiconductor package may include a first semiconductor chip and a first lead frame unit. The first lead frame unit includes a first inner lead, a first outer lead and a first heat-resistant insulation member. The first inner lead may be electrically connected to the first semiconductor chip. The first outer lead extending from the first inner lead includes a first connection portion connected to the first inner lead and a first junction portion to which an external signal is applied. The first heat-resistant insulation member covers an upper surface and a lower surface of the first connection portion. The first heat-resistant insulation member may have a first opening partially exposing the upper surface of the first connection portion. The second semiconductor package may be arranged on the first semiconductor package. The second semiconductor package may include a second semiconductor chip and a second lead frame unit. The second lead frame unit may include a second inner lead, a second outer lead and a second heat-resistant insulation member. The second inner lead may be electrically connected to the second semiconductor chip. The second outer lead extending from the second inner lead may include a second connection portion to the second inner lead and a second junction portion to which an external signal is applied. The second heat-resistant insulation member may cover an upper surface and a lower surface of the second connection portion. A conductive member may be formed to electrically connect the first connection portion exposed through the first opening with the second junction portion.

According to example embodiments, a heat-resistant insulation member may surround (or be formed on both sides on a connection portion of an outer lead. The outer lead and a dummy outer lead in each package of a stacked semiconductor package may have substantially the same shape. As such, it may not be necessary to perform an additional formation process and a cutting process for the outer lead and the dummy outer lead.

BRIEF DESCRIPTION OF THE DRAWINGS

Example embodiments will be more clearly understood from the following detailed description taken in conjunction with the accompanying drawings. FIGS. 1-17 represent non-limiting, example embodiments as described herein.

FIG. 1 is a diagram illustrating a plan view of a lead frame unit in accordance with example embodiments;

FIG. 2 is diagram illustrating an enlarged plan view of region A in FIG. 1;

FIG. 3 is a diagram illustrating a cross-sectional view taken along line I-I' in FIG. 2;

FIG. 4 is a diagram illustrating a cross-sectional view taken along line II-II' in FIG. 2;

FIG. 5 is a diagram illustrating a cross-sectional view of a semiconductor package in accordance with example embodiments;

FIG. 6 is a diagram illustrating a cross-sectional view of the semiconductor package in FIG. 5 mounted on a circuit board;

FIG. 7 is a flow chart illustrating a method of manufacturing a semiconductor package in accordance with example embodiments;

FIGS. 8-14 are diagrams illustrating cross-sectional views of a method of manufacturing a semiconductor package in accordance with example embodiments;

FIG. 15 is a diagram illustrating a cross-sectional view of a stacked semiconductor package in accordance with example embodiments;

FIG. 16 is a diagram illustrating a cross-sectional view of a stacked semiconductor package in FIG. 15 mounted on a circuit board; and FIG. 17 is a diagram illustrating an exploded cross-sectional view of a method of manufacturing a stacked semiconductor package in accordance with example embodiments.

DETAILED DESCRIPTION OF EXAMPLE EMBODIMENTS

Figure 1:
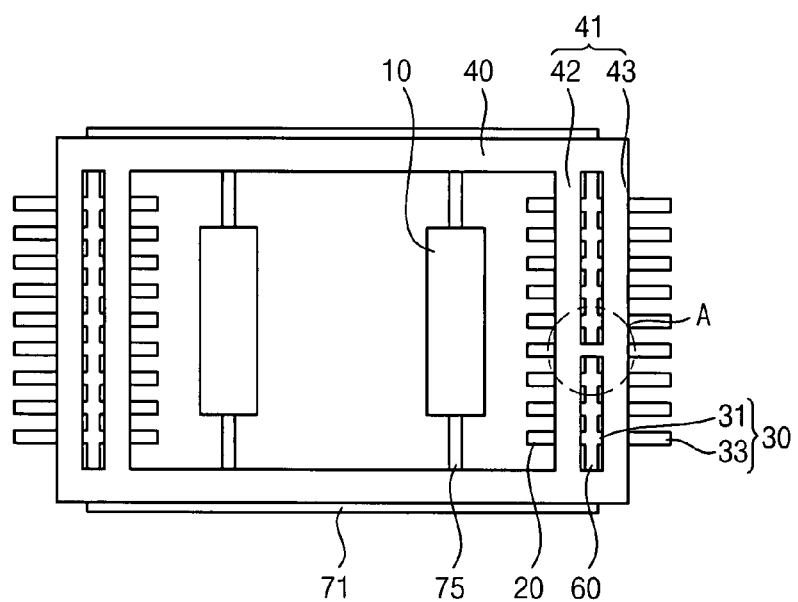

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Figure 2:
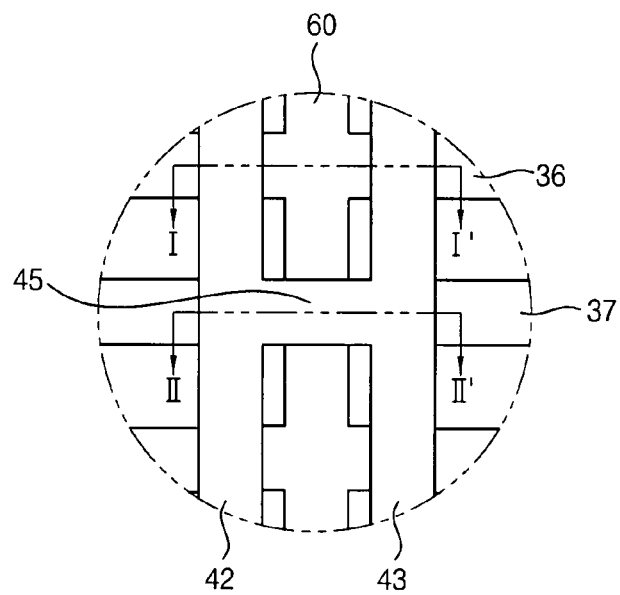
Figure 3:
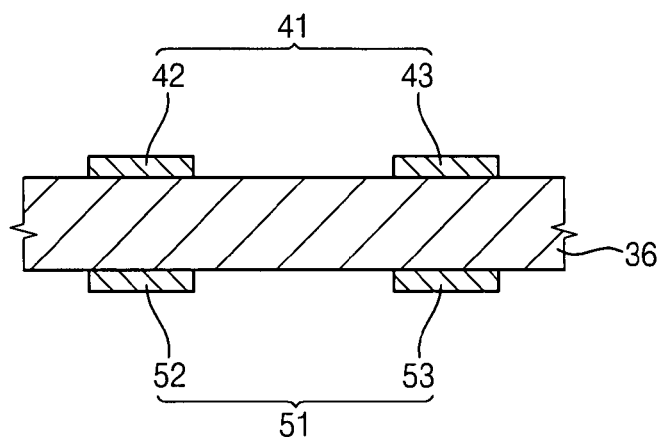
Figure 4:
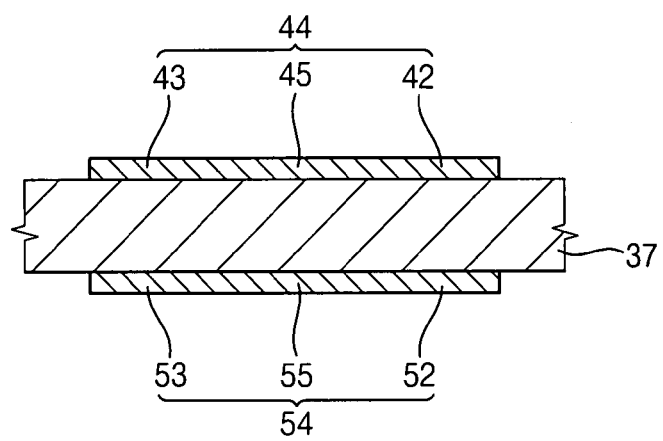

Example embodiments relate to a lead frame unit, a semiconductor package having a lead frame unit, a stacked semiconductor package having a semiconductor package and methods of manufacturing the same FIG. 1 is a diagram illustrating a plan view of a lead frame unit in accordance with example embodiments. FIG. 2 is a diagram illustrating an enlarged plan view of region A in FIG. 1. FIG. 3 is a diagram illustrating a cross-sectional view taken along line I-I' in FIG. 2. FIG. 4 is a diagram illustrating a cross-sectional view taken along line II-II' in FIG. 2.

Referring to FIGS. 1, 2, 3 and 4, a lead frame unit 100 includes a die pad 10, an inner lead 20, an outer lead 30 and a heat-resistant insulation member 40.

The lead frame unit 100 may be manufactured by performing a press processing on a base metal plate (not shown) having a thin thickness. In example embodiments, the base metal may include, for example, Alloy 42 (an alloy of iron (Fe) and nickel (Ni)). The Alloy 42 may include about 58 percent by weight (wt %) of iron (Fe) and about 42 percent by weight (wt %) of nickel (Ni).

The die pad 10 may have a shape corresponding to a plan shape of a semiconductor chip (not shown). The semiconductor chip may be placed on an upper surface of the die pad 10. An adhesive insulation member (not shown) may be positioned between the semiconductor chip and the upper surface of the die pad 10. In example embodiments, the die pad 10 may include a plurality of bands (not shown) formed parallel with each other. The die pad 10 may have the shape of a quadrilateral plate.

The die pad 10 may be spaced apart from the inner lead 20 as will be discussed later. The lead frame unit 100 may include a rail 71 and a tie bar 75 that fixes (or attaches) the die pad 10 to the lead frame unit 100.

A plurality of the inner leads 20 may be spaced apart from the die pad 10 by a predetermined gap. Each of the inner leads 20 may have a substantially narrow width. Each of the inner leads 20 may be electrically connected to a bonding pad (not shown) of the semiconductor chip on the die pad 10. For example, the bonding pad of the semiconductor chip and the corresponding inner lead 20 may be bonded to each other by a conductive wire (not shown).

Each of a plurality of the outer leads 30 extends from each of the inner leads 20, respectively. Each of the outer leads 30 may be directly connected to a terminal of an external electronic device (not shown) (e.g., a printed circuit board (PCB)) by a solder (not shown).

The outer leads 30 may include a selected outer lead 36 as illustrated in FIGS. 2 and 3. The outer leads 30 may include a dummy outer lead 37 as illustrated in FIGS. 2 and 4. The selected outer lead 36 may input and output an electrical signal. The dummy outer lead 37 does not input and output an electrical signal.

Each of the outer leads 30 may include a connection portion 31 and a junction portion 33. The connection portion 31 connects the corresponding inner lead 20 with the junction portion 33. An electrical signal from the external electronic device may be applied to the junction portion 33.

In example embodiments, the inner leads 20 and the outer leads 30 may be integrally formed. The inner leads 20 and the outer leads 30 may be divided (or spaced apart) by a molding member (not shown) in order to protect the semiconductor chip and the conductive wire. For example, each of the inner leads 20 may refer to a portion of a lead positioned at the inside of the molding member. Each of the outer leads 30 may refer to a portion of a lead positioned at the outside of the molding member.

A dam bar 60 may be formed between the outer leads 30 and the rail 71 such that a gap between the outer leads 30 is constant. The dam bar 60, the tie bar 75 and the rail 71 may be removed from a semiconductor package during an individualization process for the semiconductor package.

The heat-resistant insulation member 40 may be formed around (or surrounding) the connection portion 31 of each of the outer leads 30. The heat-resistant insulation member 40 may include Teflon or polyimide. The heat-resistant insulation member 40 may be an electrical insulator. The heat-resistant insulation member 40 may be heat-resistant and/or physically stable such that the heat-resistant insulation member 40 can withstand a high-temperature process (e.g., a soldering process) performed to electrically connect the outer leads 30 to the terminal of the circuit board.

The heat-resistant insulation member 40 may surround the connection portion 31 of each of the outer leads 30. A solder may not be adhered to the connection portion 31 of each of the outer leads 30. If the junction portion 33 of each of the outer leads 30 is electrically connected to the terminal of the circuit board by a soldering process, a molten solder may be restrained (or prohibited) from migrating to the connection portion 31 of the corresponding outer lead 30. The solder may remain between each of the outer leads 30 and the terminal of the circuit board in order to prevent (or reduce) contact defects between the outer leads 30 and the terminal of the circuit board.

The heat-resistant insulation member 40 may have a strip shape extending along a direction substantially perpendicular to a direction along which the outer leads 30 extend. Hereinafter, a "strip direction" is referred to as the direction substantially perpendicular to a direction along which the outer leads 30 extend. The heat-resistant insulation member 40 surrounds the connection portion 31 of each of the outer leads 30, simplifying a formation process of the heat-resistant insulation member 40.

The heat-resistant insulation member 40 may include first heat-resistant insulation films 41 and 44 formed on an upper surface of the connection portion 31. The heat-resistant insulation member 40 may include second heat-resistant insulation films 51 and 54 formed on a lower surface of the connection portion 31.

The first heat-resistant insulation films 41 and 44 extend along the strip direction. The first heat-resistant insulation films 41 and 44 may include a first strip portion 42 and a second strip portion 43 being spaced apart from the first strip portion 42, respectively. The dam bar 60 may be positioned between the first strip portion 42 and the second strip portion 43. A solder (not shown) may be adhered (or affixed) to each of the outer leads 30 partially exposed between the first strip portion 42 and the second strip portion 43.

As a result of the above, if the lead frame unit 100 is used in a stacked semiconductor package, a solder may be adhered (or affixed) to the upper surface of each of the outer leads 30 of a lower semiconductor package. The solder adhered (or affixed) to the upper surface of each outer lead 30 of the lower semiconductor package may be electrically connected to the corresponding outer lead 30 of an upper semiconductor package to form the stacked semiconductor package.

The first heat-resistant insulation film 44 on the dummy outer lead 37 may include a first overlap portion 45. The first overlap portion 45 connects the first strip portion 42 with the second strip portion 43. The first overlap portion 45 may overlap with the connection portion 31. The first overlap portion 45, the first strip portion 42 and the second strip portion 43 may be integrally formed with one another.

If the lead frame unit 100 including the first heat-resistant insulation film 44 having the first overlap portion 45 is used in a stacked semiconductor package, the first heat-resistant insulation film 44 of a lower semiconductor package may contact each of the outer leads 30 of an upper semiconductor package mounted on the lower semiconductor package. As such, the outer leads 30 of the lower semiconductor package and the outer leads 30 of the upper semiconductor package may be electrically insulated from each other.

The first heat-resistant insulation films 41 and 44 may be formed on the upper surface of the connection portion 31. The upper surface of the junction portion 33 of the selected outer lead 36 may be partially exposed by the first heat-resistant insulation film 41. A solder may be adhered (or affixed) to the upper surface of the junction portion 33 of the selected outer lead 36. Each of the outer leads 30 may be electrically connected to the circuit board by the solder adhered (or affixed) to the upper surface of the junction portion 33 of the selected outer lead 36.

The second heat-resistant insulation films 51 and 54 may include a first strip portion 52 and a second strip portion 53 extending along the strip direction. The first strip portion 52 and the second strip portion 53 may be spaced apart from each other. The dam bar 60 may be positioned between the first strip portion 52 and the second strip portion 53. The second heat-resistant insulation films 51 and 54 may correspond to the first heat-resistant insulation films 41 and 44, respectively.

In example embodiments, the second heat-resistant insulation film 54 positioned on the lower surface of the dummy outer lead 37 may include a second overlap portion 55. The second overlap portion 55 connects the first strip portion 52 with the second strip portion 53. The second overlap portion 55 may overlap with the connection portion 31. The second overlap portion 55, the first strip portion 52 and the second strip portion 53 of the second heat-resistant insulation film 54 may be integrally formed.

The lead frame unit 100 may include a plating layer (not shown) formed on the inner leads 20 and the outer leads 30. The plating layer may be formed on the entire surface of the lead frame unit 100. The plating layer may be only formed on the outer leads 30. The plating layer may include tin (Sn) or a like element or compound.

According to the example embodiments, the lead frame units 100 may be have substantially the same shape as a lower semiconductor package and an upper semiconductor package of a stacked semiconductor package. If the lower semiconductor package includes a selected outer lead 36 transmitting an electrical signal and the upper semiconductor package includes a dummy outer lead 37 not transmitting an electrical signal, it may not be necessary to perform a forming process or a cutting process for the selected outer lead 36 and the dummy outer lead 37 of the upper semiconductor package, simplifying the manufacturing process for the stacked semiconductor package.

Figure 5:
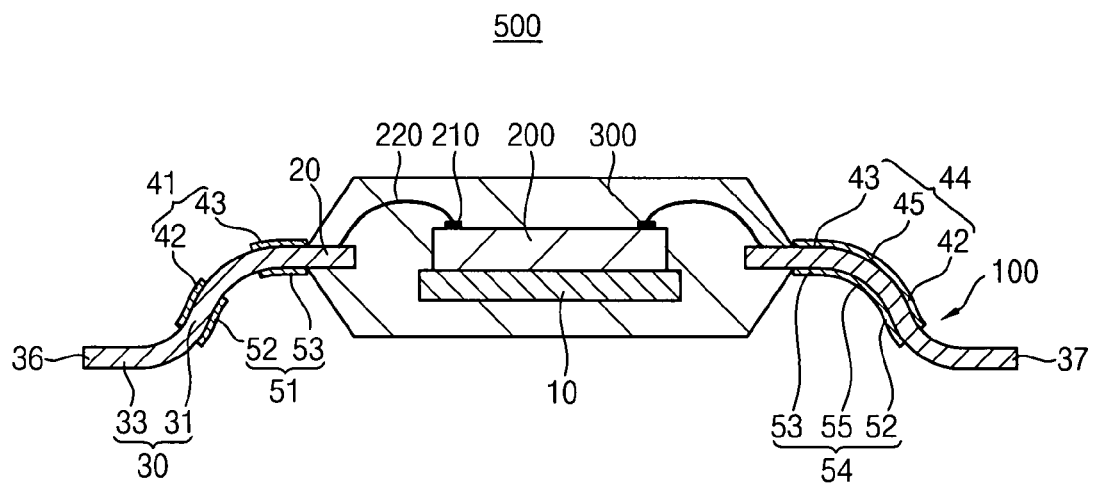

FIG. 5 is a diagram illustrating a cross-sectional view of a semiconductor package in accordance with example embodiments.

Referring to FIG. 5, a semiconductor package 500 includes a semiconductor chip 200, a lead frame unit 100 and a molding member 300.

The semiconductor chip 200 may have the shape of a thin plate. The semiconductor chip 200 may include a plurality of thin-film transistors (TFTs) (not shown) for storing data and a peripheral circuit (not shown) for processing stored data.

The semiconductor chip 200 may include a plurality of bonding pads 210 formed on a surface of the semiconductor chip 200. The bonding pads 210 may be used for signal processing in an interior of the semiconductor chip 200 or used for inputting/outputting a signal processed in the interior of the semiconductor chip 200.

A lead frame unit 100 may include a die pad 10, an inner lead 20, an outer lead 30 and a heat-resistant insulation member (not shown).

The lead frame unit 100 may be manufactured by performing a pressing process of a base metal plate having a substantially thin thickness. In example embodiments, the base metal may include Alloy 42 (an alloy of iron (Fe) and nickel (Ni)). The Alloy 42, for example, may include about 58 percent by weight of iron (Fe) and about 42 percent by weight of nickel (Ni).

The die pad 10 may have a shape corresponding to a plan shape of a semiconductor chip 200. The semiconductor chip 200 may be placed on an upper surface of the die pad 10. An adhesive insulation member (not shown) may be positioned between the semiconductor chip 200 and the upper surface of the die pad 10. In example embodiments, the die pad 10 may include a plurality of bands (not shown) formed parallel with each other. The die pad 10 may have the shape of a quadrilateral plate.

A plurality of the inner leads 20 may be spaced apart from the die pad 10 by a predetermined gap. Each of the inner leads 20 has a substantially narrow width. Each of the inner leads 20 may be electrically connected to each of the bonding pads 210 of the semiconductor chip 200 on the die pad 10. For example, each of the bonding pads 210 of the semiconductor chip 200 and each of the inner leads 20 may be bonded to each other, respectively, by a conductive wire 220.

Each of a plurality of the outer leads 30 extends from each of the inner leads 20, respectively. Each of the outer leads 30 may be directly connected to a terminal of an external electronic device (e.g., a PCB) by a solder.

Each of the outer leads 30 may include a connection portion 31 connected to each of the inner leads 20 and a junction portion 33 to which an electrical signal from the external electronic device is applied.

In example embodiments, the inner leads 20 and the outer leads 30 may be integrally formed with each other. The inner leads 20 and the outer leads 30 may be divided by the molding member 300 protecting the semiconductor chip 200 and the conductive wire 220.

If the plurality of the outer leads 30 is formed, the outer leads 30 may include a selected outer lead 36 and a dummy outer lead 37.

Each of the inner leads 20 connected to the selected outer lead 36 may be electrically connected to a bonding pad 210 of the semiconductor chip 200. Each of the inner leads 20 connected to the dummy outer lead 37 may be electrically insulated from the corresponding bonding pad 210 of the semiconductor chip 200.

The dummy outer lead 37 may be electrically connected to the corresponding bonding pad 210 of the semiconductor chip 200. No data signal may be input or output between the dummy outer lead 37 and the corresponding bonding pads 210 of the semiconductor chip 200.

A dam bar 60 may be formed between the outer leads 30 and the rail 71 such that a gap between the outer leads 30 is constant. The dam bar 60, the tie bar 75 and the rail 71 may be removed from the semiconductor package 500 during an individualization process for the semiconductor package 500.

The heat-resistant insulation member may surround the connection portion 31 of each of the outer leads 30. The heat-resistant insulation member may include first heat-resistant insulation films 41 and 44 formed on an upper surface of the connection portion 31. The heat-resistant insulation member may include second heat-resistant insulation films 51 and 54 formed on a lower surface of the connection portion 31.

The heat-resistant insulation member may include Teflon, polyimide, etc. The heat-resistant insulation member may be an electrical insulator. The heat-resistant insulation member may be heat-resistant and physically stable such that the heat-resistant insulation member can withstand a high temperature process (e.g., a soldering process) performed to electrically connect the outer leads 30 with the soldering pad of the PCB.

The heat-resistant insulation member may have a strip shape extending along a direction substantially perpendicular to a direction along which the outer leads 30 extend. Hereinafter, a strip direction is referred to as the direction substantially perpendicular to a direction along which the outer leads 30 extend. The heat-resistant insulation member surrounds the connection portion 31 of each of the outer leads 30, simplifying the formation process of the heat-resistant insulation member.

The first heat-resistant insulation films 41 and 44 extend along the strip direction. The first heat-resistant insulation films 41 and 44 may include a first strip portion 42 and a second strip portion 43 spaced apart from the first strip portion 42, respectively. The dam bar 60 may be positioned between the first strip portion 42 and the second strip portion 43. A solder may be adhered (or affixed) to the selected outer lead 36 partially exposed between the first strip portion 42 and the second strip portion 43.

As a result of the above, if the lead frame unit 100 is used in a stacked semiconductor package, a solder may be adhered (or affixed) to the upper surface of the selected outer lead 36 of a lower semiconductor package 500. The solder adhered (or affixed) to the upper surface of the selected outer lead 36 of a lower semiconductor package 500 may be electrically connected to a selected outer lead of an upper semiconductor package mounted on the lower semiconductor package 500 to form the stacked semiconductor package.

The first heat-resistant insulation film 44 on the dummy outer lead 37 may include a first overlap portion 45. The first overlap portion 45 connects the first strip portion 42 with the second strip portion 43. The first overlap portion 45 overlaps with the connection portion 31. The first overlap portion 45, the first strip portion 42 and the second strip portion 43 may be integrally formed with each other.

A solder may not be adhered (or affixed) to the connection portion 31 of the dummy outer lead 37. The solder may remain (or be contained) between each of the outer leads 30 and the terminal of the circuit board to prevent (or reduce) contact defects between the outer leads 30 and the terminal of the circuit board.

The first heat-resistant insulation films 41 and 44 may be only formed on the upper surface of the connection portion 31. The upper surface of the junction portion 33 may be exposed. A solder may be adhered (or affixed) to the upper surface of the junction portion 33, the lower surface of the junction portion 33 and the terminal of the PCB. The outer lead 30 may be electrically connected to the PCB by the solder adhered to the upper surface and the lower surface of the junction portion 33 and the circuit board.

The second heat-resistant insulation films 51 and 54 extend along the strip direction. The second heat-resistant insulation films 51 and 54 may include a first strip portion 52 and a second strip portion 53. The first strip portion 52 and the second strip portion 53 may be spaced apart from each other. The dam bar 60 may be positioned between the first strip portion 52 and the second strip portion 53 of the second heat-resistant insulation films 51 and 54. The second heat-resistant insulation films 51 and 54 may correspond to the first heat-resistant insulation films 41 and 44.

In example embodiments, the second heat-resistant insulation film 54 on the lower surface of the dummy outer lead 37 may include a second overlap portion 55. The second overlap portion 55 connects the first strip portion 52 with the second strip portion 53. The second overlap portion 55 may overlap with the connection portion 31 of the dummy outer lead 37. The second overlap portion 55, the first strip portion 52 and the second strip portion 53 of the second heat-resistant insulation film 54 may be integrally formed.

The molding member 300 surrounds the semiconductor chip 200, the conductive wire 220 and the inner leads 20 to protect the semiconductor chip 200, the conductive wire 220 and the inner leads 20 from mechanical impact.

Figure 6:
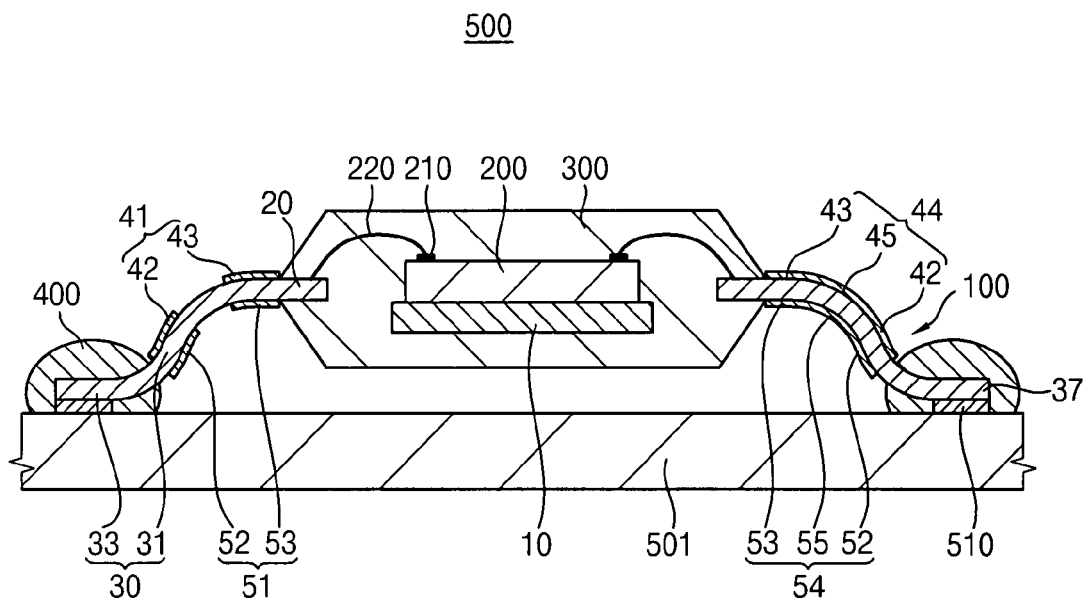

FIG. 6 is a diagram illustrating a cross-sectional view of the semiconductor package 500 in FIG. 5 mounted on a circuit board.

Referring to FIG. 6, the semiconductor package 500 may include a conductive member 400. The conductive member 400 may connect the outer lead 30 with the solder pad 510 of the circuit board 501. The conductive member 400 may include a solder.

If the conductive member 400 includes a solder, a molten solder may be adhered (or affixed) to the junction portion 33 instead of the connection portion 31 surrounded by the heat-resistant insulation member. The molten solder may be restrained from climbing the upper surface and the lower surface of the connection portion 31 by the heat-resistant insulation member. The solder may remain substantially between the outer lead 30 and the solder pad 510 of the circuit board 501. A distance between the junction portion 33 and the solder pad 510 of the circuit board 501 may not be excessively decreased to prevent (or decrease) shear stress (due to external impact) from being focused on the conductive member 400.

The growth of whiskers on the connection portion 31 of the outer lead 30 may be suppressed because the connection portion 31 is surrounded by the heat-resistant insulation member.

Figure 7:
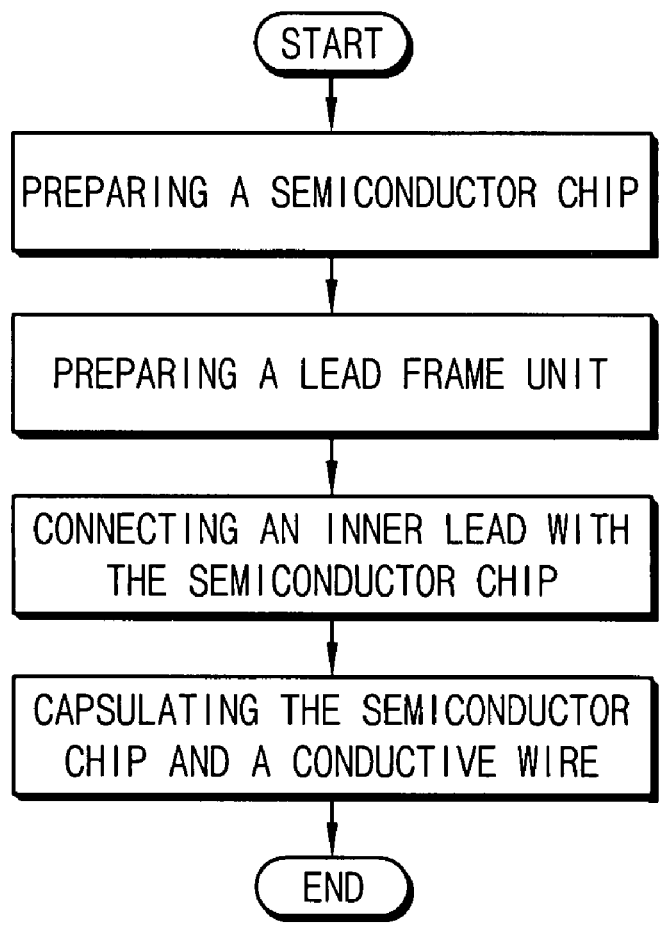

FIG. 7 is a flow chart illustrating a method of manufacturing a semiconductor package in accordance with example embodiments.

Referring to FIG. 7, the method of manufacturing a semiconductor package according to example embodiments may include preparing a semiconductor chip (S10), preparing a lead frame unit (S20), electrically connecting the semiconductor chip with an inner lead of the lead frame unit (S30), and capsulating the semiconductor chip and the inner lead with a molding member (S40).

Figure 8:
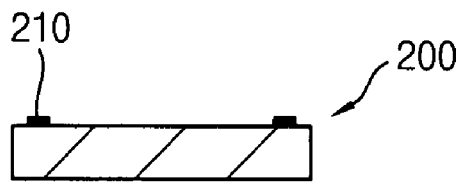

FIGS. 8 to 14 are diagrams illustrating cross-sectional views of a method of manufacturing a semiconductor package in accordance with example embodiments. FIG. 8 is a diagram illustrating a cross-sectional view of a semiconductor chip 200 of a semiconductor package.

Referring to FIGS. 7 and 8, the semiconductor chip 200 may be prepared. A data signal from the exterior may be applied to the semiconductor chip 200 or the semiconductor chip 200 may output the data signal to the exterior. According to example embodiments, the semiconductor chip 200 may include a bonding pad 210. The bonding pad 210 may be electrically connected to an electronic device formed on the interior of the semiconductor chip 200.

Figure 9:
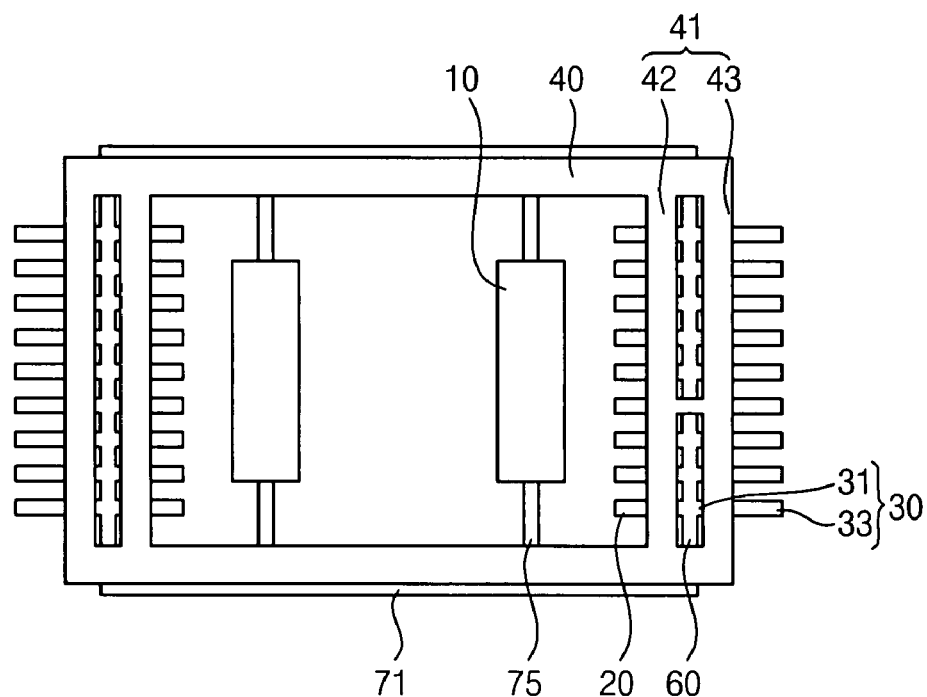

FIG. 9 is a diagram illustrating a plan view of a lead frame unit of a semiconductor package.

Referring to FIGS. 7 and 9, a lead frame unit 100 may be prepared. The lead frame unit 100 may include a die pad 10, an inner lead 20, an outer lead 30 and a heat-resistant insulation member 40. The lead frame unit 100 may be substantially the same as the lead frame unit 100 illustrated in FIGS. 1 to 4.

Figure 10:
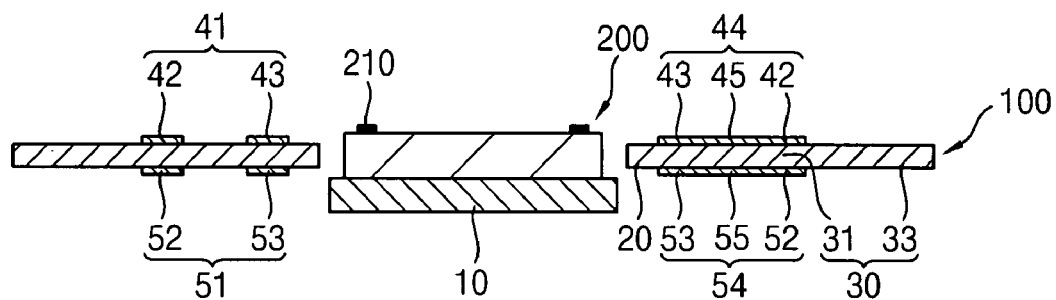

FIG. 10 is a diagram illustrating a cross-sectional view of a semiconductor chip placed (or mounted) on a die pad of a lead frame unit.

Referring to FIGS. 7 and 10, the semiconductor chip 200 may be placed on the die pad 10 of the lead frame unit 100. A lower surface of the semiconductor chip 200 may be firmly adhered (or affixed) to an upper surface of the die pad 10 by an adhesive member formed between the semiconductor chip 200 and the die pad 10. The adhesive member may include a heat-resistant insulation material capable of retaining adhesive properties during a subsequent high-temperature process.

Figure 11:
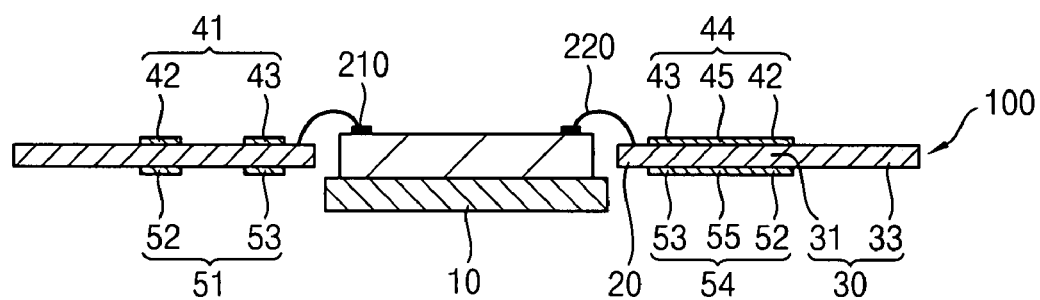

FIG. 11 is a diagram illustrating a cross-sectional view of a bonding pad of a semiconductor chip and an inner lead of a lead frame unit electrically connected to each other.

Referring to FIGS. 7 and 11, the bonding pad 210 of the semiconductor chip 200 may be electrically connected to the inner lead 20 of the lead frame unit 100. For example, the bonding pad 210 may be electrically connected to the inner lead 20 by a wire bonding process. A conductive wire 220 may be used in the wire bonding process.

Figure 12:
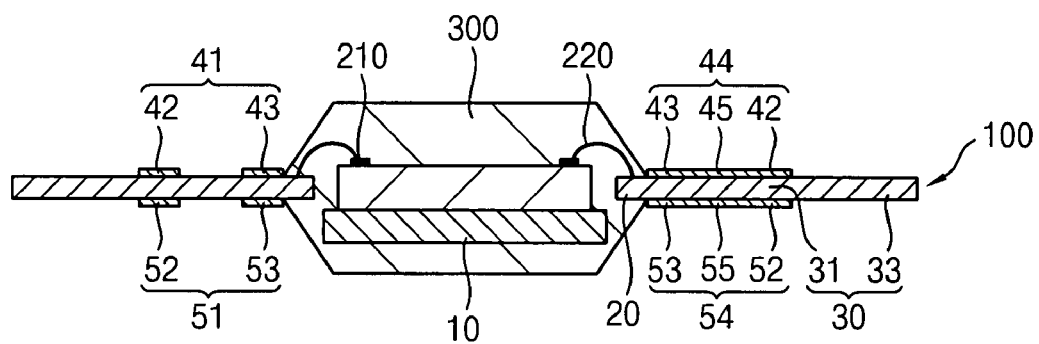

FIG. 12 is a diagram illustrating a cross-sectional view of a conductive wire and a semiconductor chip, both capsulated by a molding member.

Referring to FIGS. 7 and 12, the conductive wire 220 and the semiconductor chip 200 may be capsulated by the molding member 300. The molding member 300 protects the conductive wire 220 and the semiconductor chip 200. The molding member 300 may include an epoxy resin.

Figure 13:
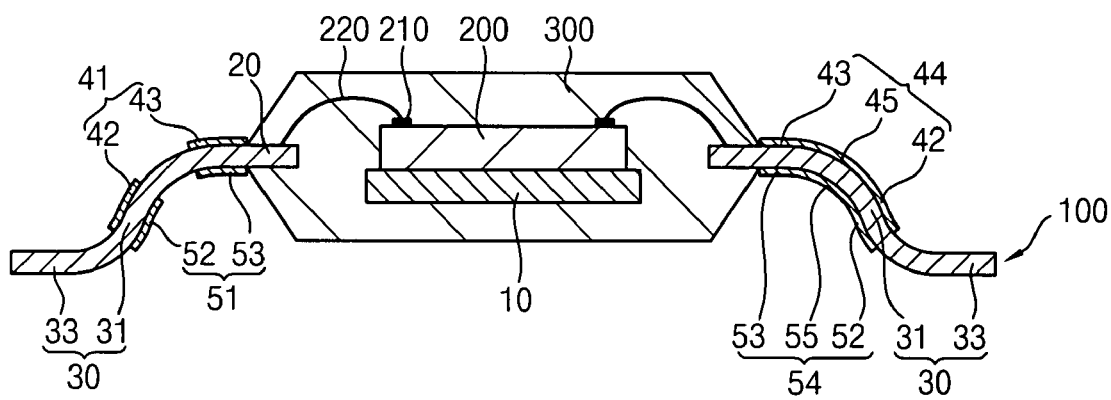

FIG. 13 is a diagram illustrating a cross-sectional view of a bent outer lead.

Figure 14:
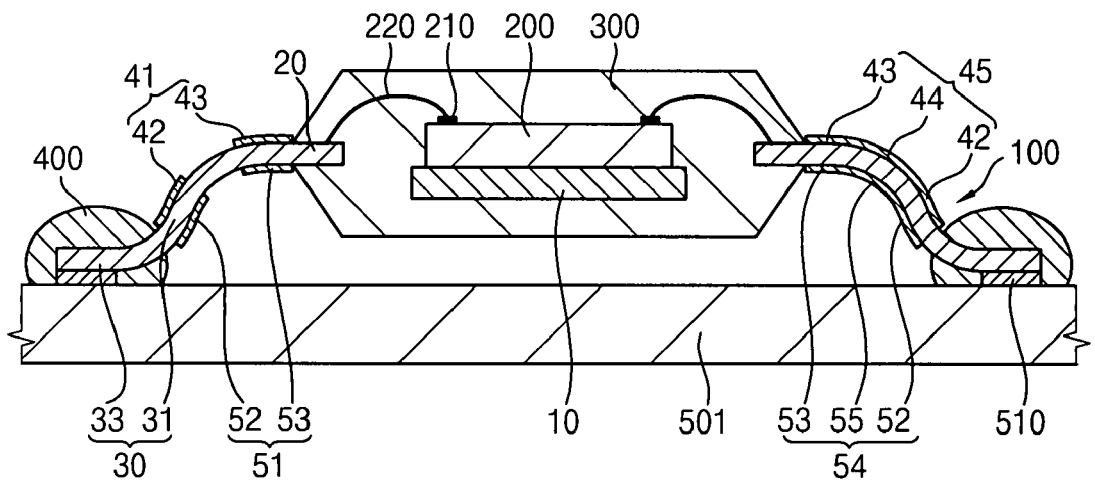

Referring to FIG. 13, the outer lead 30 may be bent such that a junction portion 33 may surface a solder pad 510 of a circuit board 501 shown in FIG. 14. For example, the outer lead 30 may be bent twice such that the outer lead 30 has a slanted "S" shape or a "Z" shape.

FIG. 14 is a diagram illustrating a cross-sectional view of an outer lead placed on a circuit board.

Referring to FIG. 14, the outer lead 30 may be electrically connected to the circuit board 501 by a conductive member 400. The conductive member 400 may include a solder. If the conductive member 400 includes a solder, the solder may be formed between the junction portion 33 of the outer lead 30 and the solder pad 510 of the circuit board 501. The solder may be molten by an infrared pulse at a temperature above the melting temperature of the solder. The junction portion 33 and the solder pad 510 may be electrically connected to each other by a molten solder.

Figure 15:
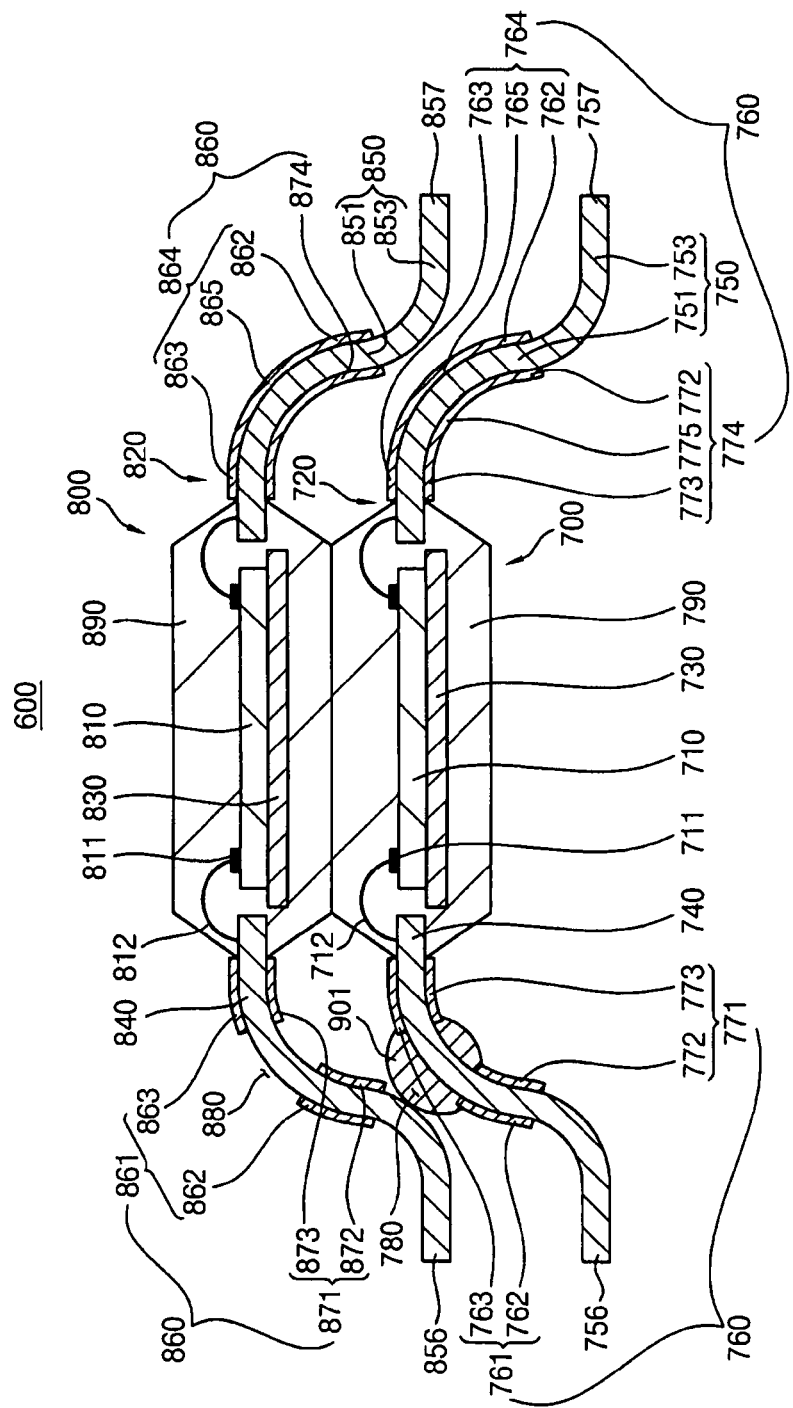

FIG. 15 is a diagram illustrating a cross-sectional view of a stacked semiconductor package in accordance with example embodiments.

Referring to FIG. 15, a stacked semiconductor package 600 includes a first semiconductor package 700, a second semiconductor package 800 and a first conductive member 901.

The first semiconductor package 700 may include a first semiconductor chip 710 and a first lead frame unit 720.

The first semiconductor chip 710 may include a circuit member (not illustrated) and a first bonding pad 711 electrically connected to the circuit member. The first semiconductor chip 710 may input and output a data signal.

The first lead frame unit 720 may include a first die pad 730, a first inner lead 740, a first outer lead 750 and a first heat-resistant insulation member (not shown).

The first die pad 730 and the first inner lead 740 may be substantially the same as the die pad 10 and the inner lead 20 illustrated in FIGS. 5 and 6, respectively.

The first outer lead 750 may refer to a first selected outer lead 756 transmitting an electrical signal and a first dummy outer lead 757 not transmitting an electrical signal. The first outer lead 750 may include a first junction portion 753 and a first connection portion 751. The first junction portion 753 may be electrically connected to an external terminal. The first connection portion 751 connects with the first inner lead 740 and the first junction portion 753, respectively.

The first heat-resistant insulation member 760 may include first heat-resistant insulation films 761 and 764 and second heat-resistant insulation films 771 and 774. The first heat-resistant insulation films 761 and 764 may be positioned on an upper surface of the first connection portion 751 of the first outer lead 750. The second heat-resistant insulation films 771 and 774 may be positioned on a lower surface of the first connection portion 751 of the first outer lead 750.

The first heat-resistant insulation films 761 and 764 may have a strip shape. The first heat-resistant insulation films 761 and 764 may include a first strip portion 762 and a second strip portion 763, respectively.

The first strip portion 762 and the second strip portion 763 may be spaced apart from each other. The first strip portion 762 may extend along a direction substantially perpendicular to a direction along which the first outer lead 750 extends.

The first connection portion 751 may be partially exposed between the first strip portion 762 and the second strip portion 763. A first opening 780 may be formed in a space between the first strip portion 762 and the second strip portion 763.

The first conductive member 901 (e.g., a solder) may be adhered (or affixed) to the first connection portion 751 of the first selected outer lead 756 partially exposed through the first opening 780 such that the first conductive member 901 may cover (or surround) the first opening 780.

The first heat-resistant insulation film 764 on the first dummy outer lead 757 may include a first overlap portion 765. The first overlap portion 765 connects the first strip portion 762 with the second strip portion 763. The first overlap portion 765 may cover (or surround) the first opening 780. The first overlap portion 765 may include the same material as the first strip portion 762 and the second strip portion 763. The first overlap portion 765 may be integrally formed with the first strip portion 762 and the second strip portion 763.

The second heat-resistant insulation films 771 and 774 may have substantially the same shape corresponding to the shape of the first heat-resistant insulation films 761 and 764, respectively. The second heat-resistant insulation films 771 and 774 may include the same material as the first heat-resistant insulation films 761 and 764.

In example embodiments, the second heat-resistant insulation films 771 and 774 may be positioned on the lower surfaces of a first selected outer lead 756 and a first dummy outer lead 757, respectively.

The second heat-resistant insulation films 771 and 774 may include a first strip portion 772 and a second strip portion 773, respectively. The second heat-resistant insulation film 774 positioned on a lower surface of the first dummy outer lead 757 may include a second overlap portion 775 between the first strip portion 772 and the second strip portion 773.

The first semiconductor package 700 may include a first molding member 790. The first molding member 790 may surround the first semiconductor chip 710 and the first lead frame unit 720. The first molding member 790 may be formed by an epoxy resin.

The second semiconductor package 800 may be mounted on the first semiconductor package 700. The second semiconductor package 800 may include a second semiconductor chip 810 and a second lead frame unit 820. The second semiconductor chip 810 may include a circuit element (not shown) and a second bonding pad 811 electrically connected to the circuit element.

The second lead frame unit 820 may include a second die pad 830, a second inner lead 840, a second outer lead 850 and a second heat-resistant insulation member (not shown).

The second outer lead 850 may refer to a second selected outer lead 856 transmitting an electrical signal and a second dummy outer lead 857 not transmitting an electrical signal.

In example embodiments, the second selected outer lead 856 corresponds to the first selected outer lead 756. The second dummy outer lead 857 corresponds to the first dummy outer lead 757.

The second outer lead 850 may include a second connection portion 851 electrically connected to the second inner lead 840 and a second junction portion 853 electrically connected to an external terminal and the second connection portion 851.

The second heat-resistant insulation member 860 may have a strip shape. The second heat-resistant insulation member 860 may include third heat-resistant insulation films 861 and 864 and fourth heat-resistant insulation films 871 and 874.

The third heat-resistant insulation films 861 and 864 may be positioned on an upper surface of the second connection portion 851 of the second outer lead 850. The fourth heat-resistant insulation films 871 and 874 may be positioned on a lower surface of the second connection portion 851 of the second outer lead 850.

The third heat-resistant insulation films 861 and 864 may include a third strip portion 862 and a fourth strip portion 863, respectively. The third strip portion 862 and the fourth strip portion 863 may be spaced apart from each other. The third strip portion 862 and the fourth strip portion 863 may extend along a direction substantially perpendicular to a direction along which the second outer lead 850 extends.

The second connection portion 851 may be partially exposed between the third strip portion 862 and the fourth strip portion 863. A second opening 880 may be formed in a space between the third strip portion 862 and the fourth strip portion 863.

The third heat-resistant insulation film 864 positioned on the upper surface of the second dummy outer lead 857 may include a third overlap portion 865 in addition to the third strip portion 862 and the fourth strip portion 863. The third overlap portion 865 may be formed on the second connection portion 851 of the second dummy outer lead 857 partially opened by the second opening 880, such that the third overlap portion 865 may cover (or surround) the second opening 880.

The third overlap portion 865 may include the same material as the third strip portion 862 and the fourth strip portion 863. The third overlap portion 865 may be integrally formed with the third strip portion 862 and the fourth strip portion 863.

The third heat-resistant insulation films 861 positioned on the upper surface of the second selected outer lead 856 may only include the third strip portion 862 and the fourth strip portion 863.

The fourth heat-resistant insulation films 871 and 874 may have substantially the same shape corresponding to the shape of the third heat-resistant insulation films 861 and 864, respectively. The fourth heat-resistant insulation films 871 and 874 and the third heat-resistant insulation films 861 and 864 may be formed using the same material.

In example embodiments, the fourth heat-resistant insulation films 871 and 874 may be positioned on the lower surface of the second selected outer lead 856 and the second dummy outer lead 857, respectively. The fourth heat-resistant insulation film 874 on the lower surface of the second dummy outer lead 857 may include the third strip portion 862, the fourth strip portion 863 and the forth overlap portion between the third strip portion 862 and the fourth strip portion 863.

The first conductive member 901 (e.g., a solder) electrically connects the first selected outer lead 756 with the second selected outer lead 856. The first conductive member 901 may be electrically connected to the first connection portion 751 of the first selected outer lead 756 partially exposed through the first opening 780 and. The first conductive member 901 may be electrically connected to the second junction portion 853 of the second selected outer lead 856.

As described above, the first heat-resistant insulation film 864 may be positioned on the first connection portion 751 of the first dummy outer lead 750. The first heat-resistant insulation film 864 includes the first overlap portion 765. A solder may not be adhered (or affixed) to the first overlap portion 765. If the second junction portion 853 of the second dummy outer lead 857 contacts the first heat-resistant insulation film 764 on the first dummy outer lead 757, the first dummy outer lead 757 and the second dummy outer lead 857 may be electrically insulated from each other.

Figure 16:
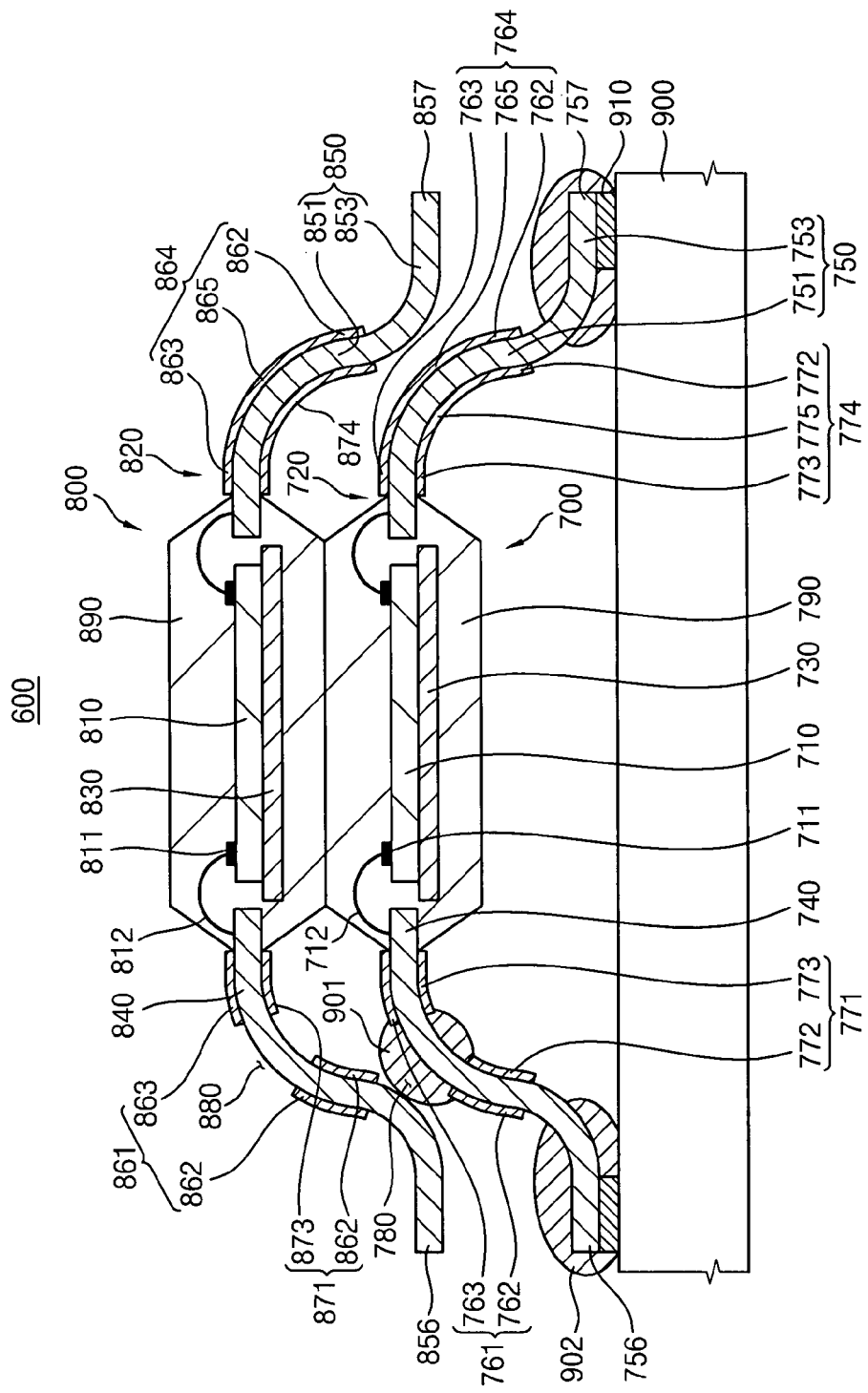

FIG. 16 is a diagram illustrating a cross-sectional view of the stacked semiconductor package in FIG. 15 mounted on a circuit board.

Referring to FIG. 16, the stacked semiconductor package 600 may include a circuit board 900 and a second conductive member 902.

The second conductive member 902 may electrically connect the first outer lead 750 with a solder pad 910 of the circuit board 900. The second conductive member 902 may include a solder.

If the second conductive member 902 includes a solder, a molten solder may be adhered (or affixed) to the first junction portion 753 instead of the first connection portion 751 surrounded by the first heat-resistant insulation member. The molten solder may be restrained from migrating to the upper surface and the lower surface of the first connection portion 751 by the first heat-resistant insulation member. The solder may remain substantially between the first junction portion 753 and the solder pad 910 of the circuit board 900. A distance between the first junction portion 753 and the solder pad 910 of the circuit board 900 may not be decreased excessively in order to prevent (or reduce) shear stress (due to external impact) from being focused on the second conductive member 902.

The growth of whiskers on the first connection portion 751 and the second connection portion 851 may be suppressed because the first connection portion 751 and the second connection portion 851 are surrounded by the first heat-resistant insulation member and the second heat-resistant insulation member, respectively.

FIG. 17 is a diagram illustrating an exploded cross-sectional view of a method of manufacturing the stacked semiconductor package 600 in accordance with example embodiments.

Referring to FIG. 17, the first semiconductor package 700 and the second semiconductor package 800 are prepared. The first connection portion 751, which is a portion of the first selected outer lead 756 of the first semiconductor package 700 that is exposed, may be mounted on the second junction portion 853 of the second selected outer lead 856 of the second semiconductor package 800. The first connection portion 751 may be electrically connected to the second junction portion 853 by the first conductive member to manufacture the stacked semiconductor package 600.

According to example embodiments, a heat-resistant insulation member may surround (or be formed on both sides of) a connection portion of an outer lead. The outer lead and a dummy outer lead in each package of a stacked semiconductor package may have substantially the same shape. As such, it may not be necessary to perform additional processes to form and cut the outer lead and the dummy outer lead.

A conductive member (e.g., a solder) may substantially remain between a junction portion of the outer lead and a terminal of a circuit board. A distance between the junction portion and the terminal of the circuit board may not be decreased excessively in order to prevent (or reduce) contact defects between the outer lead and the terminal of the circuit board.

A connection portion of the outer lead may be surrounded by the heat-resistant insulation member. As such, whiskers may be suppressed from growing on the connection portion of the outer lead.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A lead frame unit, comprising:

a die pad for supporting a semiconductor chip;

an inner lead configured to electrically connect to the semiconductor chip;

an outer lead having a connection portion extending from the inner lead and a junction portion extending from the connection portion, wherein an external signal is applied to the junction portion; and a heat-resistant insulation member surrounding the connection portion, the heat-resistant insulation member including a first heat-resistant insulation film positioned on an upper surface of the connection portion and a second heat-resistant insulation film positioned on a lower surface of the connection portion opposite to the upper surface, wherein the heat-resistant insulation member has a strip shape extending along a direction substantially perpendicular to an extending direction of the outer lead.

2. The lead frame unit of claim 1, wherein the heat-resistant insulation member includes Teflon or polyimide.

3. The lead frame unit of claim 1, wherein each of the first heat-resistant insulation film and the second heat-resistant insulation film includes a first strip portion and a second strip portion spaced apart from the first strip portion, wherein the first strip portion and the second strip portion extend parallel to the direction of the heat-resistant insulation member.

4. The lead frame unit of claim 3, further comprising a dam bar connected to a plurality of the outer leads such that a distance between the outer leads is uniform.

5. The lead frame unit of claim 3, wherein each of the first heat-resistant insulation film and the second heat-resistant insulation film includes an overlap portion connecting the first strip portion with the second strip portion.

6. A semiconductor package, comprising:
a semiconductor chip;
the lead frame unit according to claim 1; and
a molding member surrounding the semiconductor chip and a plurality of inner leads.

7. The semiconductor package of claim 6, further comprising:
a circuit board having a solder pad corresponding to the junction portion; and
a conductive member electrically connecting the solder pad with the junction portion.

8. The semiconductor package of claim 6, wherein the heat-resistant insulation member includes Teflon or polyimide.

9. The semiconductor package of claim 6, wherein each of the first heat-resistant insulation film and the second heat-resistant insulation film has an opening partially exposing the upper surface and the lower surface of the connection portion.

10. A stacked semiconductor package, comprising:
a first semiconductor package, including a first semiconductor chip and a first lead frame unit,
wherein the first lead frame unit includes a first inner lead electrically connected to the first semiconductor chip, a first outer lead having a first connection portion extending from the first inner lead and a first junction portion extending from the first connection portion wherein an external signal is applied to the first junction portion, and a first heat-resistant insulation member being positioned on an upper surface of the first connection portion and a lower surface of the first connection portion opposite to the upper surface wherein the first heat-resistant insulation member has a first opening partially exposing the upper surface of the first connection portion;
a second semiconductor package including a second semiconductor chip mounted on the first semiconductor package and a second lead frame unit,
wherein the second lead frame unit includes a second inner lead electrically connected to the second semiconductor chip, a second outer lead having a second connection portion extending from the second inner lead and a second junction portion extending from the second connection portion wherein an external signal is applied to the second junction portion, and a second heat-resistant insulation member being positioned on an upper surface of the second connection portion and a lower surface of the second connection portion opposite to the upper surface; and
a conductive member electrically connecting the first connection portion partially exposed by the first opening with the second junction portion.

11. The stacked semiconductor package of claim 10, wherein the second heat-resistant insulation member has a second opening partially exposing the upper surface of the second connection portion.

12. The stacked semiconductor package of claim 10, wherein
the first outer lead includes a first selected outer lead and a first dummy outer lead; and
the second outer lead includes a second selected outer lead corresponding to the first selected outer lead and a second dummy outer lead corresponding to the first dummy outer lead.

13. The stacked semiconductor package of claim 12, wherein
a portion of the first heat-resistant insulation member positioned on the first dummy outer lead includes a first overlap portion filling up the first opening; and
the first overlap portion contacts the second junction portion of the second dummy outer lead.

14. The stacked semiconductor package of claim 13, wherein the first heat-resistant insulation member and the first overlap portion are integrally formed.

15. A method of manufacturing a semiconductor package, comprising:
preparing a semiconductor chip;
preparing a lead frame unit by mounting the semiconductor chip on a die pad, electrically connecting an inner lead to the semiconductor chip, forming an outer lead having a connection portion extending from the inner lead and a junction portion extending from the connection portion wherein an external signal is applied to the junction portion, and forming a heat-resistant insulation member including a first heat-resistant insulation film positioned on an upper surface of the connection portion and a second heat-resistant insulation film positioned on a lower surface of the connection portion opposite to the upper surface; and
molding the inner lead and the semiconductor chip, wherein forming the heat-resistant insulation member includes forming the heat-resistant insulation member in a strip shape extending along a direction substantially perpendicular to an extending direction of the outer lead.

16. The method of claim 15, further comprising:
preparing a circuit board having a solder pad corresponding to the junction portion; and
electrically connecting the junction portion with the solder pad by a solder.

17. A method of manufacturing a stacked semiconductor package, comprising:
preparing a first semiconductor package including a first semiconductor chip and a first lead frame unit,
wherein the first lead frame unit is formed by electrically connecting a first inner lead to the first semiconductor chip, forming a first outer lead having a first connection portion extending from the first inner lead and a first junction portion extending from the first connection portion wherein an external signal is applied to the first junction portion, and positioning a first heat-resistant insulation member on an upper surface of the first connection portion and a lower surface of the first connection portion opposite to the upper surface wherein the first heat-resistant insulation member has a first opening partially exposing the upper surface of the first connection portion;

preparing a second semiconductor package including a second semiconductor chip and a second lead frame unit,
wherein the second lead frame unit is formed by electrically connecting a second inner lead to the second semiconductor chip, forming a second outer lead having a second connection portion extending from the second inner lead and a second junction portion extending from the second connection portion wherein an external signal is applied to the second junction portion, and positioning a second heat-resistant insulation member on an upper surface of the second connection portion and a lower surface of the second connection portion opposite to the upper surface;
mounting the second semiconductor package on the first semiconductor package; and
forming a conductive member electrically connecting the first connection portion partially exposed by the first opening to the second junction portion.

18. The method of claim 17, further comprising a plurality of first outer leads, wherein each first outer lead is classified as a first selected outer lead or a first dummy outer lead; and a plurality of second outer leads, wherein each second outer lead is classified as a second selected outer lead or a second dummy outer lead.

19. The method of claim 18, wherein mounting the second semiconductor package on the first semiconductor package includes placing each second selected outer lead on one of the first selected outer leads, and each second dummy outer lead on one of the first dummy outer leads.

20. The method of claim 19, wherein a portion of the first heat-resistant insulation member is positioned on the first dummy outer lead and includes an overlap portion filling up the first opening, and the overlap portion is insulated from the second junction portion.

* * * * *